(12) United States Patent  
Naji (10) Patent No.: US 6,515,895 B2
(45) Date of Patent: Feb. 4, 2003

(54) NON-VOLATILE MAGNETIC REGISTER (75) Inventor: Peter K. Naji, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 121 days.

(21) Appl. No.: 09/774,949

(22) Filed: Jan. 31, 2001

(65) Prior Publication Data

US 2002/0101761 A1 Aug. 1, 2002

(51) Int. Cl.$^7$ .............................................. G11C 11/04
(52) U.S. Cl. ...................................... 365/171; 365/154
(58) Field of Search .............................. 365/171, 154, 365/158, 173, 50, 170

(56) References Cited

U.S. PATENT DOCUMENTS

| | | | | |
|---|---|---|---|---|
| 5,065,362 A | * | 11/1991 | Herdt et al. ................. | 365/154 |
| 5,361,224 A | | 11/1994 | Takasu ......................... | 365/145 |
| 5,751,627 A | | 5/1998 | Ooishi .......................... | 365/145 |
| 6,021,065 A | * | 2/2000 | Daughton et al. ........... | 365/145 |
| 6,097,629 A | * | 8/2000 | Dietrich et al. .............. | 365/154 |
| 6,147,922 A | | 11/2000 | Hurst, Jr. et al. ........... | 365/225.5 |
| 6,175,525 B1 | | 1/2001 | Fulkerson et al. ...... | 365/189.05 |
| 6,178,111 B1 | | 1/2001 | Sather et al. ................ | 365/158 |
| 6,269,027 B1 | * | 7/2001 | Hurst et al. .................. | 365/154 |
| 6,304,477 B1 | * | 10/2001 | Naji ............................ | 365/158 |

OTHER PUBLICATIONS

"Differential type giant magnetoresistive memory using spin–valve film with a NiO pinning layer," Yamane et al., Journal of Applied Physics, vol. 83, No. 9, May 1, 1998, pp. 4862–4868.

* cited by examiner

Primary Examiner—Richard Elms
Assistant Examiner—Anh Phung
(74) Attorney, Agent, or Firm—William E. Koch (57) ABSTRACT

A non-volatile, bistable magnetic tunnel junction (MTJ) register cell includes first and second magnetic tunnel junctions connected for differential operation. The first MTJ is coupled between an easy axis line and an output terminal and the second MTJ is coupled between an inverse easy axis line and an inverse output terminal. A hard axis line is coupled magnetically to the MTJs and an enable line is coupled to the MTJs for enabling and disabling the differential operation. The MTJ register cell can be connected as a PIPO non-volatile register, a right or left non-volatile shift register, or a multi-bit bi-directional non-volatile shift register.

23 Claims, 7 Drawing Sheets

NON-VOLATILE MAGNETIC REGISTER

FIELD OF THE INVENTION

This invention relates to registers, such as flip-flops, shift registers and the like, and more specifically to various magnetic registers that are non-volatile.

BACKGROUND OF THE INVENTION

Non-volatile registers are data storage circuits which retain stored information in the absence of power. Current non-volatile registers use flash memory cells to accomplish data storage in a non-volatile fashion. One problem with the use of flash memory cells is the fact that the accompanying memories in devices such as computers and the like are formed from different types of memory cells, e.g. magnetic random access memory (MRAM) cells and the like. Using different types of memory cells results in a requirement for different fabrication processes, which can substantially increase the complexity of the manufacturing process and, thereby, greatly increase the cost.

A type of magnetic register has been proposed, which uses spin dependent magnetic tunneling memory cells (see for example, U.S. Pat. No. 6,021,065, entitled "Spin Dependent Tunneling Memory", issued Feb. 1, 2000). Generally, these types of devices suffer from metastablity problems. Also, the magnetic tunnel junctions are operated in the major magnetic loop, which makes them slow and the programming requires relatively high currents.

The present invention also contemplates the fabrication of non-volatile shift registers and, to date, no non-volatile shift registers have been proposed. Thus, no prior art for non-volatile shift registers is known at this time.

Accordingly it is highly desirable to provide non-volatile registers which overcome these problems.

BRIEF DESCRIPTION OF THE DRAWINGS

Referring to the drawings.

DESCRIPTION OF THE PREFERRED EMBODIMENTS

Figure 1:
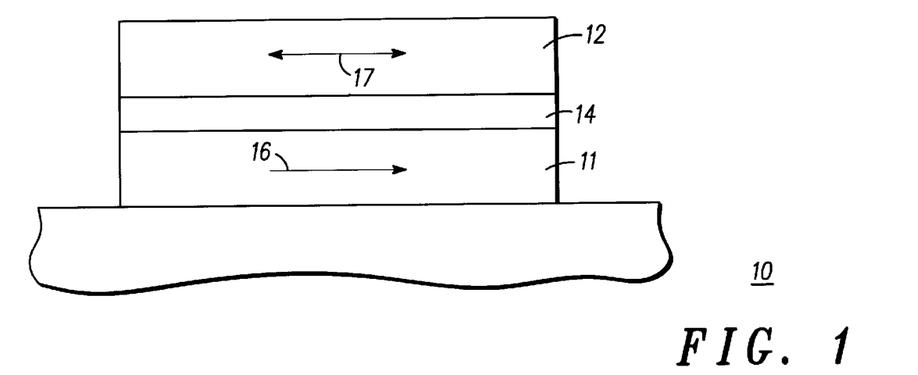
FIG. 1 is a simplified sectional view of a MTJ cell generally as used in the present disclosure.

Turning now to the figures and specifically to FIG. 1, a simplified sectional view of a magnetic tunneling junction (MTJ) cell 10, generally as used in the present disclosure, is illustrated to briefly describe the operation of this type of MTJ cell. MTJ cell 10 includes a pair of layers 11 and 12 of magnetic material. Layers 11 and 12 have a layer 14 of tunnel barrier material sandwiched therebetween. As is known in the art, layers 11 and 12 are each generally formed of a plurality of layers of magnetic material, such as cobalt (Co), nickel (Ni), iron (Fe), and the like. Layer 14 is formed of some nonconductive material such as aluminum oxide, aluminum nitride, or the like.

One of the layers of magnetic material, layer 11 in this description, has a larger switching field so that its magnetic vector, represented by arrow 16, hereinafter vector 16, is always pointed in the same direction (pinned) when the applied magnetic field is less than its switching field. The magnetic vector of layer 12, represented by arrow 17, hereinafter vector 17, has a smaller switching field and is free, but constrained by the physical size of layer 12, to point in either of two directions when the applied magnetic field is larger than its switching field. Cell 10 is used by connecting it in a circuit such that electricity flows vertically through cell 10 from one of the layers 11 or 12 to the other. Cell 10 can be electrically represented as a resistor and the size of the resistance depends upon the orientation of magnetic vectors 16 and 17. As is understood by those skilled in the art, cell 10 has a relatively high resistance when magnetic vectors 16 and 17 are misaligned (point in opposite directions) and a relatively low resistance when magnetic vectors 16 and 17 are aligned.

Additional information as to the fabrication and operation of MTJ cells can be found in U.S. Pat. No. 5,702,831, entitled "Multi-Layer Magnetic Tunneling Junction Memory Cells", issued Mar. 31, 1998, and incorporated herein by reference.

Figure 2:
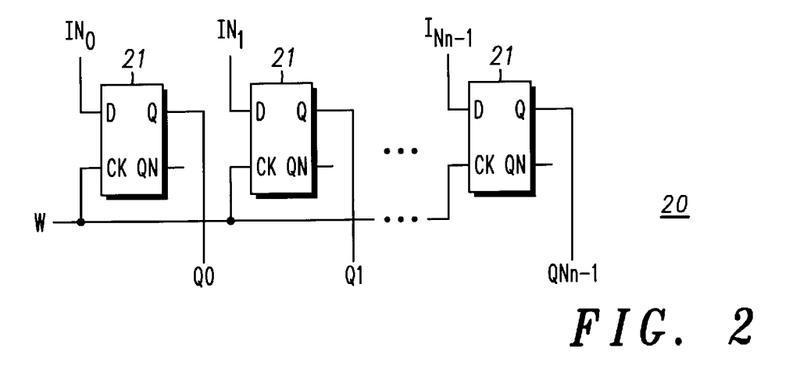
FIG. 2 is a simplified block diagram of a parallel-in-parallel-out (PIPO) register.

Turning now to FIG. 2, a simplified block diagram of an n-bit parallel-in-parallel-out (PIPO) register 20 is illustrated. Register 20 includes a plurality n of register cells 21, each of which has a data input D, a clock input CK, a data output Q and an inverse data (or data not) output QN. In PIPO register 20 a byte or word of information, including n bits $I_0$ through $I_{n-1}$, is applied in parallel to data inputs D and clocked into PIPO register 20 by a clock signal W applied simultaneously to all of the clock inputs CK. As a byte or word is clocked into PIPO register 20, any byte or word stored in register 20 is simultaneously clocked out in parallel at data outputs Q (although inverse data outputs QN could be used if convenient). The n-bit data output byte or word is generally designated as $Q_0$ through $Q_{n-1}$. As understood by those skilled in the art, PIPO registers are most commonly used as buffers and the like in most communications systems, data manipulation systems, computers, etc.

Figure 3:
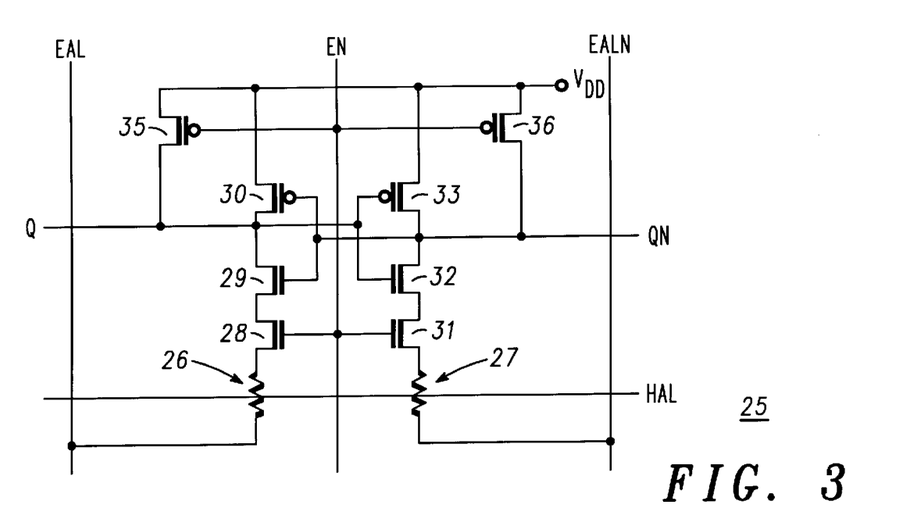
FIG. 3 is a schematic diagram of a non-volatile, bistable magnetic tunnel junction memory cell in accordance with the present invention.

Turning now to FIG. 3, a non-volatile, bistable magnetic tunnel junction register cell 25 is illustrated in accordance with the present invention. Cell 25 includes a differentially connected pair of magnetic tunnel junctions (MTJs) 26 and 27. As explained briefly above, an MTJ is used by connecting it in a circuit such that electricity flows vertically through a stack of layers forming the MTJ from one magnetic layer to another. The MTJ can be electrically represented as a resistor and the size of the resistance depends upon the orientation of two magnetic vectors in either of two stable states.

MTJs 26 and 27 are differentially connected by means of a series connected pair of transistors 28 and 29 and a differential transistor 30 and a series connected pair of transistors 31 and 32 and a differential transistor 33. An upper terminal of MTJ 28 is connected through series connected pair of transistors 28 and 29 to an output terminal Q. An upper terminal of MTJ 27 is connected through series connected pair of transistors 31 and 32 to an inverse output terminal QN. The control terminals or gates of transistors 28 and 31 are connected directly to an enable line EN. The gate of transistor 29 is connected directly to output terminal Q and the gate of transistor 32 is connected directly to inverse output terminal QN. Differential transistor 30 is connected between a power supply, designated Vdd, and output terminal Q and differential transistor 33 is connected between power supply Vdd and inverse output terminal QN. The gate of differential transistor 30 is connected directly to inverse output terminal QN and the gate of transistor 29. The gate of differential transistor 33 is connected directly to output terminal Q and the gate of transistor 32. A pair of enabling transistors 35 and 36 are connected between power supply Vdd and output terminal Q and inverse output terminal QN, respectively. The gates of enabling transistors 35 and 36 are both connected directly to enable line EN.

Figure 4:
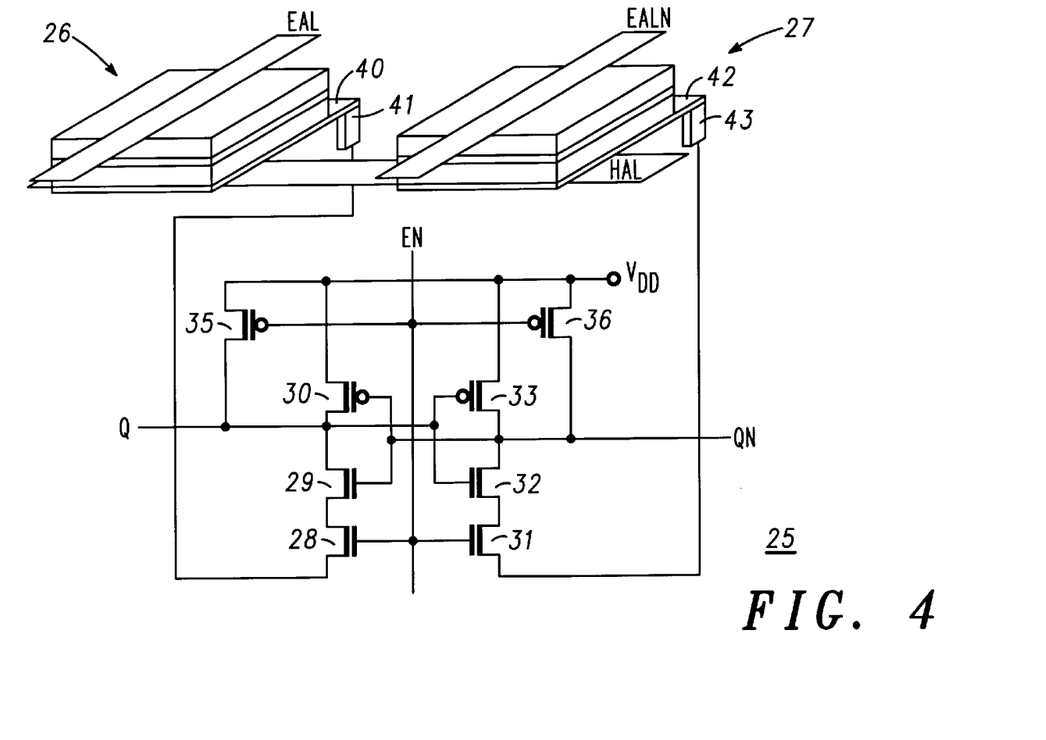
FIG. 4 is a partial isometric partial schematic diagram of the non-volatile, bistable magnetic tunnel junction memory cell of FIG. 3.

Referring additionally to FIG. 4, a partial isometric partial schematic diagram of the non-volatile, bistable magnetic tunnel junction memory cell of FIG. 3 is illustrated. In this specific embodiment, a lower (in FIG. 3) terminal of MTJ 26 is connected directly to an easy axis line EAL and a lower (in FIG. 3) terminal of MTJ 27 is connected directly to an inverted easy axis line EALN. In FIG. 4, MTJs 12 and 14 are illustrated as stacks of layers of magnetic material, insulating material, and non-magnetic conductors assembled in a well known manner. The lower terminals of MTJs 26 and 27 are at the top of the stacks of layers which form the MTJs and the upper terminals are at the bottom of the stacks. The transistors and circuitry differentially connecting MTJs 26 and 27 is formed in and on the surface of a supporting semiconductor substrate (not shown) generally below MTJs 26 and 27. MTJ 26 includes a bottom layer of conductive material 40 positioned in a layer above the connecting circuitry and connected by way of a via 41 to transistor 28. MTJ 27 includes a bottom layer of conductive material 42 (generally formed from the same layer as material 40) positioned in a layer above the connecting circuitry and connected by way of a via 42 to transistor 31.

Hard axis line HAL is formed to extend beneath both MTJs 26 and 27 and sufficiently close to produce a partial programming magnetic field in MTJs 26 and 27. Easy axis line EAL is positioned above MTJ 26, sufficiently close to produce a partial programming magnetic field in MTJ 26, and is oriented perpendicular to hard axis line HAL. Similarly, inverse easy axis line EALN is positioned above MTJ 27, sufficiently close to produce a partial programming magnetic field in MTJ 27, and is oriented perpendicular to hard axis line HAL. Thus, hard axis line HAL, easy axis line EAL, and inverse easy axis line EALN are used to address each individual cell during programming of the memory.

Cell 25 is programmed by setting enable line EN to a logic 0 (zero) and passing currents in opposite directions in easy axis line EAL and inverse easy axis line EALN. At the same time an appropriate current is supplied to hard axis line HAL. The combinations of currents creates magnetic fields at MTJ 26 and 27 that programs the two MTJs to opposite states. After programming, information stored in cell 25 can be read by setting enable line EN to a logic 1 (one) and sampling the output at output terminal Q and/or inverse output terminal QN.

More specifically, information stored in cell 25 is read as follows. First, cell 25 is placed in a precharge state by setting enable line EN equal to a logic 0 (EN=0) and both output terminal Q and inverse output terminal QN to a logic 0 (zero). After precharge is completed, enable line EN is set to a logic 1 (EN=1) and current will flow from transistor 30 to transistors 29 and 28 and through MTJ 26 to easy axis line EAL. Similarly, current will flow from transistor 33 to transistors 32 and 31 and through MTJ 27 to inverse easy axis line EALN. Easy axis line EAL and inverse easy axis line EALN are grounded. Assuming the resistance of MTJ 26 is much greater than the resistance of MTJ 27, a voltage difference starts to develop between output terminal Q and inverse output terminal QN. Once this difference becomes sufficiently large, the current flowing in transistors 29 and 28 decreases and the voltage at output terminal Q increases. Simultaneously, current in transistors 32 and 31 increases pulling inverse output terminal QN down. The increase in voltage at output terminal Q and the decrease in voltage at inverse output terminal QN starts a feedback action which ultimately raises the voltage at output terminal Q to approximately Vdd and pulls the voltage at inverse output terminal QN to approximately ground. This process, from the time cell 25 is enabled (EN=1) to the time Q and QN assume opposite logic values, is known as "regeneration".

Here it should be noted that cell 25 will never be in danger of being metastable, since during regeneration output terminal Q and inverse output terminal QN are started from a known voltage, e.g. Vdd, and provided that the difference between the resistances of MTJ 26 and 27 is sufficiently large, e.g. a minimum MR of approximately 20%. Also, transistor 30 is preferably made small relative to transistors 29 and 28 to promote faster transitions to ground of terminals Q or QN and to allow for larger MTJ values. Similarly, transistor 33 is preferably made small relative to transistors 32 and 31, for the same reasons. Further, transistors 30 and 33 are preferably sized so that the voltage across MTJ 26 or MTJ 27, respectively, when they are a minimum resistance is in a range from 100 mV to 400 mV.

Figure 5:
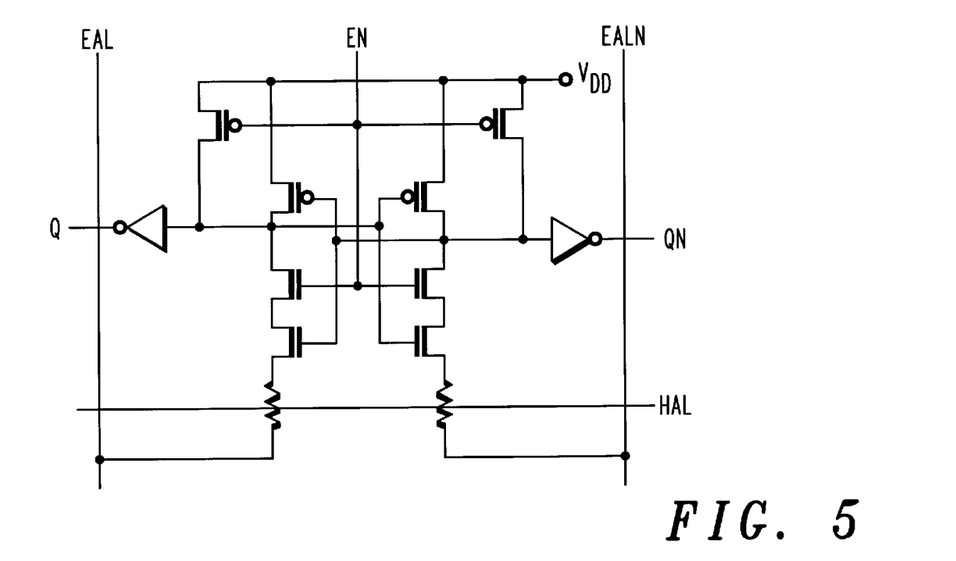
FIGS. 5, 6, and 7 illustrate several different embodiments of a non-volatile, bistable magnetic tunnel junction memory cell in accordance with the present invention.
Figure 6:
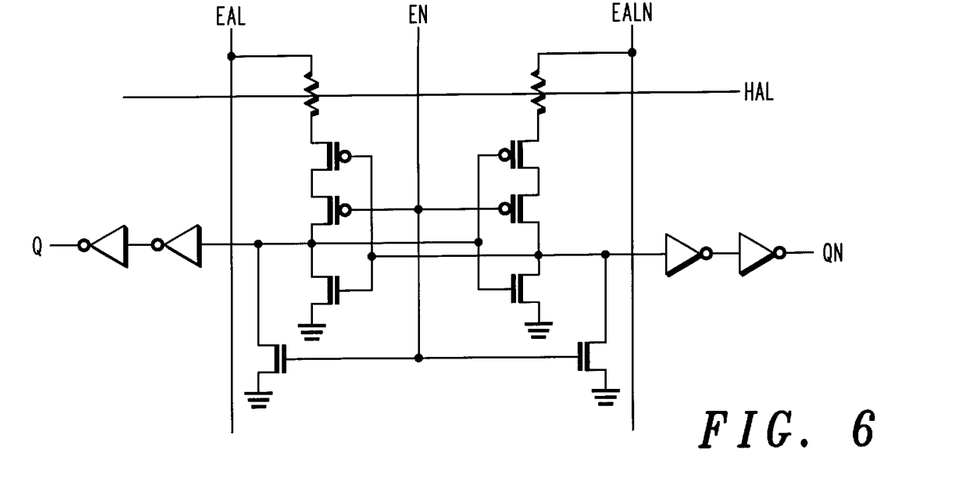
Figure 7:
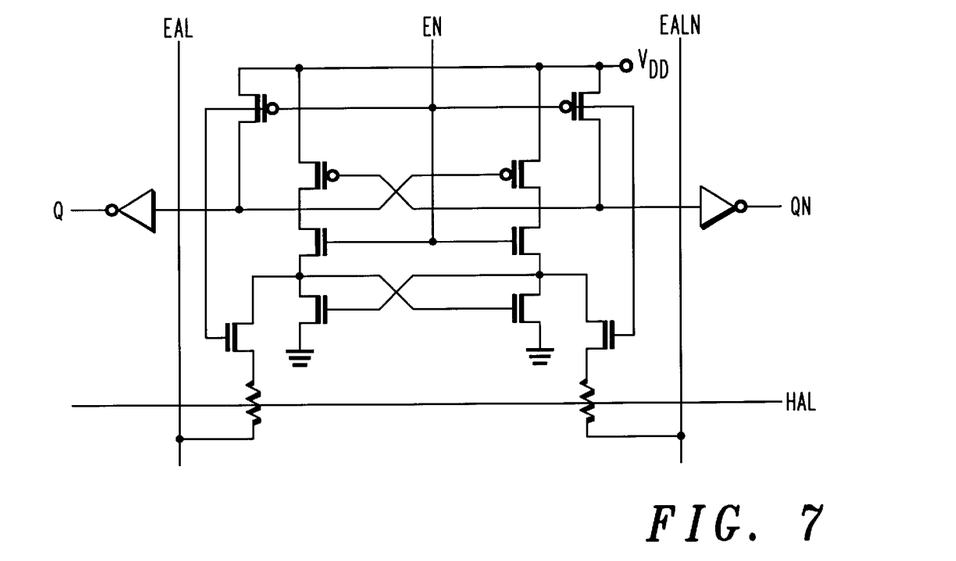

Referring to FIGS. 5, 6, and 7, several additional embodiments are illustrated of non-volatile, bistable magnetic tunnel junction memory cells in accordance with the present invention. The various embodiments illustrate potential changes in the connecting circuitry, such as different conducting transistors (e.g., N-conduction and P-conduction) and different positions of the various components.

Figure 8:
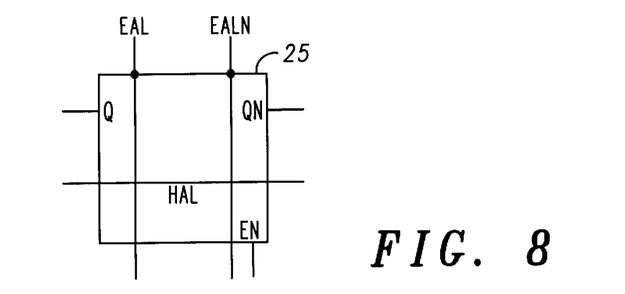
FIG. 8 is a CAMRAM cell macro view illustrating various I/O connections of the non-volatile, bistable magnetic tunnel junction memory cell of FIG. 3, or FIGS. 5, 6, or 7.

A macro view of non-volatile, bistable magnetic tunnel junction register cell 25 is illustrated in FIG. 8 showing cell 25 in block form with the various I/O connections. The macro view contains all of the structure illustrated and described in FIG. 3 (or FIGS. 4, 5, or 6) and will be used in the following embodiments and examples for easier understanding.

Figure 9:
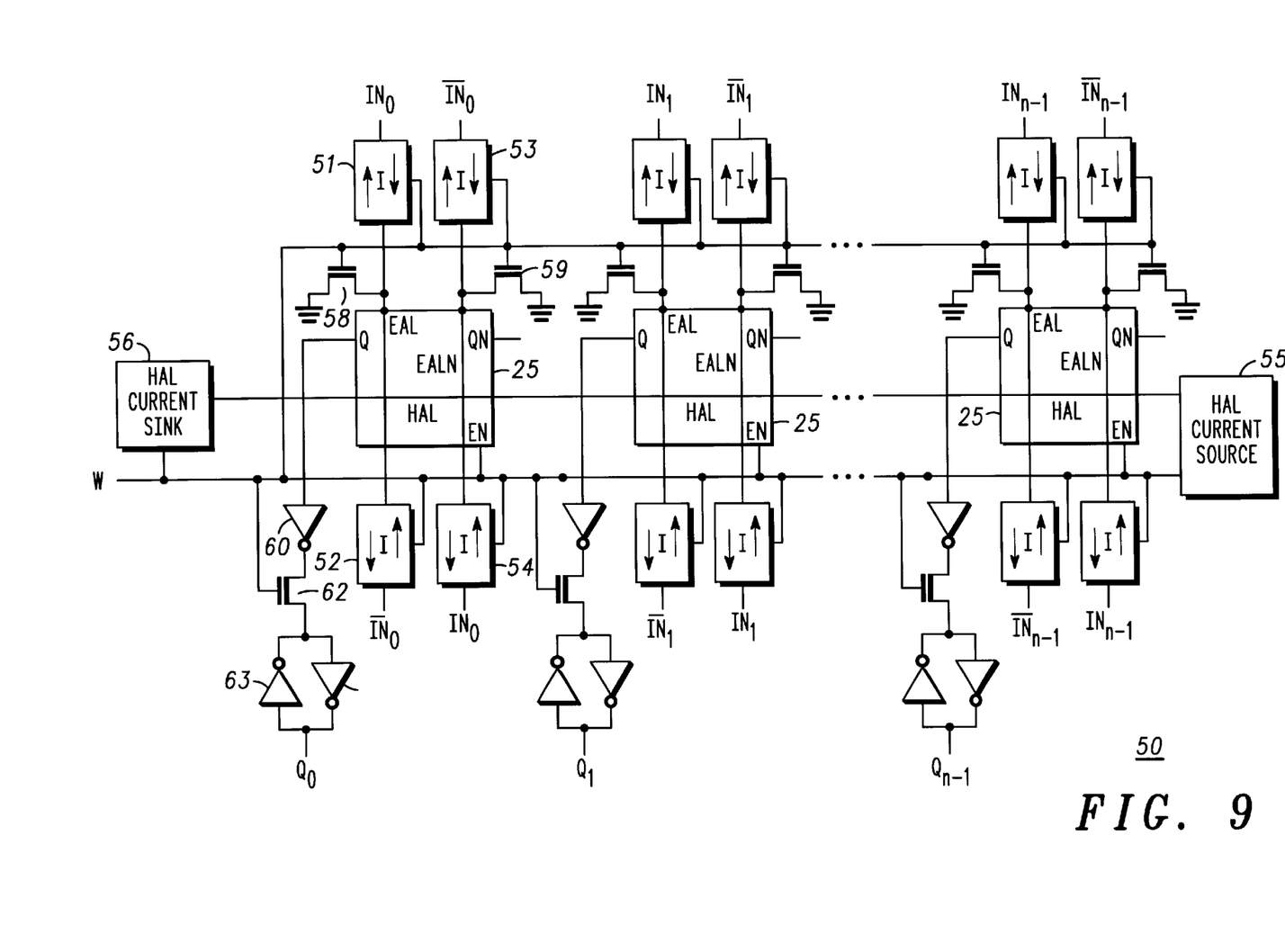
FIG. 9 is a block/schematic diagram of a non-volatile magnetic PIPO register in accordance with the present invention.

Turning now to FIG. 9, a block/schematic diagram showing a non-volatile magnetic PIPO register 50 is illustrated in accordance with the present invention. Register 50 includes a plurality, n, of non-volatile register cells 25. Since each stage of register 50 is similar, only a first stage will be described in detail. A pair of current source/sink circuits 51 and 52 are connected to opposite ends of easy axis line EAL. Circuits 51 and 54 are connected to a first stage data input $I_0$ and circuits 52 and 53 are connected to a first stage programming inverse current supply $IN_0$. Data inputs $I_0$ and $IN_0$ through $I_{n-1}$, and $IN_{n-1}$ carry differential input information to be stored in register 50. It should be understood that circuits 51 and 52 operate in opposition, that is, when one operates as a current source the other operates as a current sink and vice versa. A pair of current source/sink circuits 53 and 54 are connected to opposite ends of inverse easy axis line EALN. A current source 55 is connected to the right end of hard axis line HAL and a current sink 56 is connected to the opposite end. Data inputs $I_0$ and $IN_0$ and circuits 51 through 56 are used to supply the combination of currents which creates magnetic fields at MTJ 26 and 27 that programs the two MTJs with the desired information and to opposite states.

A clock line, designated W, is adapted to have a clock signal, repetitive alternating ones and zeros or a continuous alternating square wave, applied thereto. Clock line W is connected to a control terminal of each circuit 51 through 56 and to the enable line EN of each cell 25. A switching transistor 58 is connected between a read-out voltage Vss and easy axis line EAL and a switching transistor 59 is connected between read-out voltage Vss and inverse easy axis line EALN. The gates or control terminals of transistors 58 and 59 are connected to clock line W. Output terminal Q is connected through an invert 60 to one terminal of a switching transistor 62. The other terminal of transistor 62 is connected through a pair of inverters 63 and 64, connected in parallel back-to-back, to a first register output terminal $Q_0$. The control terminal or gate of switching transistor 62 is connected to clock line W.

In operation, when clock line W is low or a logic 0, switching transistors 58, 59, and 62 are turned off and circuits 51 through 56 are turned on to provide the desired programming in each cell 25 of register 50. That is, register 50 is programmed with the desired information input in parallel. When clock line W is high or at a logic 1, circuits 51 through 56 are turned off and switching transistors 58, 59, and 62 are turned on. With circuits 51 through 56 turned off and switching transistors 58, 59, and 62 are turned on, information stored in register 50 is read out, generally as described above. Thus, a non-volatile register is provided, which in this specific embodiment is a parallel-in-parallel-out register.

Figure 10:
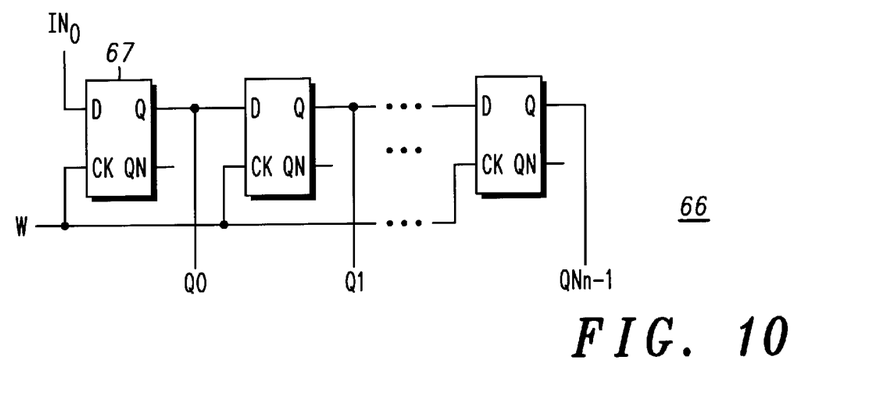
FIG. 10 is a simplified block diagram of a serial-in-serial-out (SISO) or serial in parallel out (SIPO) shift register.

Turning now to FIG. 10, a simplified block diagram is illustrated of a serial-in-serial-out (SISO) or serial in parallel out (SIPO) shift register 66. Register 66 includes a plurality of register stages 67 each of which has a data input D, a clock input CK, a data output Q and an inverse data (or data not) output QN. In SISO register 66 a bits of information are applied serially to data input D of the first stage and clocked into the stage by a clock signal W applied simultaneously to all of the clock inputs CK. As a bit is clocked into first stage 67, any bit stored in subsequent stages is simultaneously clocked into the next subsequent stage or clocked out of register 66 on output terminal $Q_{n-1}$ (although inverse data outputs QN could be used if convenient). For SIPO shift registers, $Q_{n-1}$, bits of information are applied serially to data input D of the first stage and clocked into the stage by a clock signal W. After the $Q_{n-1}$, bits of information are serially clocked into register 66, a byte or word $Q_{n-1}$ bits long is available in parallel at the $Q_0$ through $Q_{n-1}$ outputs. Thus, shift register 66 can be used as a SISO or SIPO shift register as required.

Figure 11:
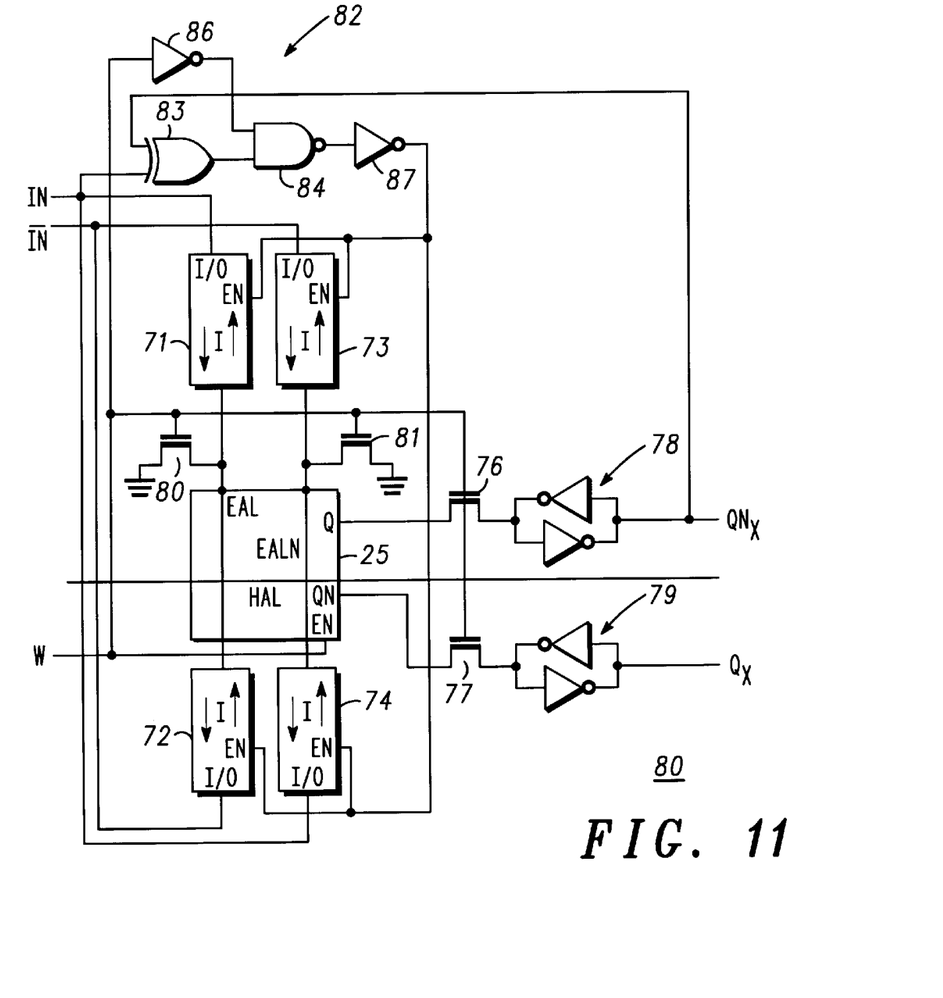
FIG. 11 is a block/schematic diagram of a single non-volatile memory stage, incorporating the memory cell of FIG. 3 (or FIGS. 5, 6, or 7), for use in non-volatile shift registers in accordance with the present invention.

Turning now to FIG. 11, a single non-volatile memory stage 70, incorporating memory cell 25 of FIG. 3 (or the cells of FIGS. 5, 6, or 7), is illustrated. Stage 70 is designed as a building block for use in non-volatile shift registers in accordance with the present invention. A pair of bi-directional current circuits or current source/sink circuits 71 and 72 are connected to opposite ends of easy axis line EAL of memory cell 25. A pair of bi-directional current circuits or current source/sink circuits 73 and 74 are connected to opposite ends of inverse easy axis line EALN of memory cell 25. I/O terminals of circuits 71 and 74 are coupled directly to a programming (data) input terminal I of stage 70. I/O terminals of circuits 72 and 73 are coupled directly to an inverse programming (data) input terminal IN of stage 70. A clock line W is connected to an enable terminal EN of memory cell 25 and memory cell 25 operates generally as described above. When clock line W is at a logic low (W=0), complimentary data, I and IN, is presented to stage 70. With W=0 current source/sink circuits 71, 72, 73, and 74 are turned on. Depending on the logic of I and IN, current flows through easy axis line EAL and inverted easy axis line EALN in opposite directions. At the same time, current flows through hard axis line HAL from a current source to a current sink (not shown). The flow of current through stage 70 programs the two MTJs in memory cell 25 to opposite states, as described above.

Clock line W is also connected to the control terminals of a pair of output switching transistors 76 and 77. Transistor 76 couples the output Q of memory cell 25 through a CMOS latch circuit 78 (a pair of back-to-back inverters) to an inverted output QN of stage 70. Transistor 77 couples the output QN of memory cell 25 through a CMOS latch circuit 79 (a pair of back-to-back inverters) to an output Q of stage 70. With W=0, the output terminals Q and QN of memmory cell 25 are at Vdd and are isolated from output terminals Q and QN of stage 70 by switching transistors 76 and 77, which are open or off.

A switching transistor 80 has a control terminal connected to clock line W and connects easy axis line EAL to a voltage potential Vss when clock line W is at a logic high (W=1). A switching transistor 81 has a control terminal connected to clock line W and connects inverse easy axis line EALN to voltage potential Vss when clock line W is at a logic high. When clock line W goes to a logic high (W–1), current source/sink circuits 71, 72, 73, and 74 are turned off and switching transistors 80 and 81 are turned on, which brings lines EAL and EALN to ground for the operation of memory cell 25. Memory cell 25 goes into the regeneration mode or phase of operation and one of the output terminals Q and QN gets pulled down to approximately ground potential while the other output terminal remains at Vdd depending on data stored in the two MTJs. Subsequently, the output signals on output terminals Q and QN of memory cell 25 are latched in CMOS latch circuits 78 and 79, respectively, and drive output terminals QN and Q, respectively, of stage 70. A simple shift register can be constructed by connecting output terminals QN and Q of a first stage 70 to the input terminals I and IN of a next subsequent stage.

In register stage 70, additional logic circuit 82 is provided to eliminate unnecessary programming current and produce a more efficient register stage. To this end, programming (data) input terminal I of stage 70 is connected to a bit comparator circuit 82. Logic circuit 82 includes a two-input exclusive OR circuit 83, one input terminal of which is connected to programming input terminal I of stage 70. A second input of exclusive OR circuit 83 is connected to the inverted output terminal QN of stage 70. An output terminal of circuit 83 is connected to one input terminal of a two-input NAND gate 84. Clock line W is connected through an inverter 86 to the second input terminal of NAND gate 84. The output terminal of NAND gate 84 is connected through an inverter 87, serving as the output terminal of logic circuit 82, to an enable terminal EN of each current source/sink circuit 71, 72, 73, and 74.

If the input data at terminals I and IN is the same as the data stored in the MTJs of memory cell 25, the programming of memory cell 25 would be redundant and a waste of programming current. Hence comparator circuit 82 compares the input data at the input I of stage 70 to the data at output QN of stage 70 when clock line W goes to a logic low (W=0). The input signal at input terminal I is applied to one input terminal of exclusive OR circuit 83, along with the output signal latched into CMOS latch circuit 78. The output signal from exclusive OR circuit 83 is loaded, along with the inverted signal on clock line W, and buffered into the enable inputs EN of current source/sink circuits 71, 72, 73, and 74. If the input signal on input terminal I equals the output signal on output terminal QN of stage 70, current source/sink circuits 71, 72, 73, and 74 are disabled. If the input signal on input terminal I is not the same as the output signal on output terminal QN of stage 70, current source/sink circuits 71, 72, 73, and 74 are enabled and the new data is loaded into stage 70. In the data read mode of operation (W=1), all four current source/sink circuits 71, 72, 73, and 74 are disabled. Thus, a building block type of non-volatile register stage is provided.

Figure 12:
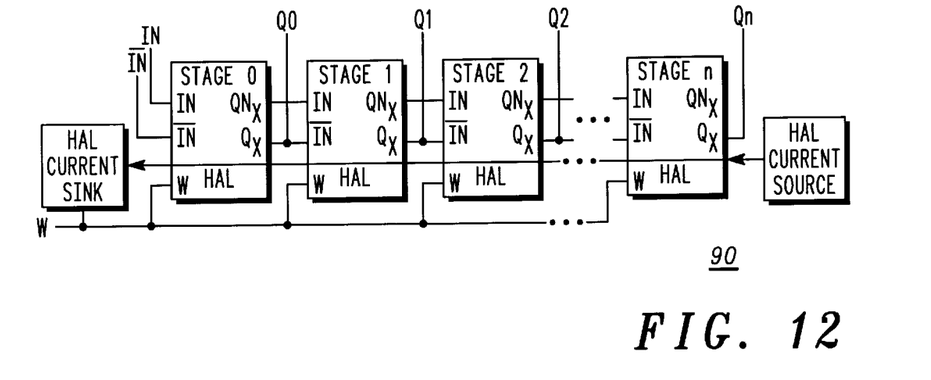
FIG. 12 illustrates a multi-stage non-volatile shift register connected for right shift operations in accordance with the present invention.
Figure 13:
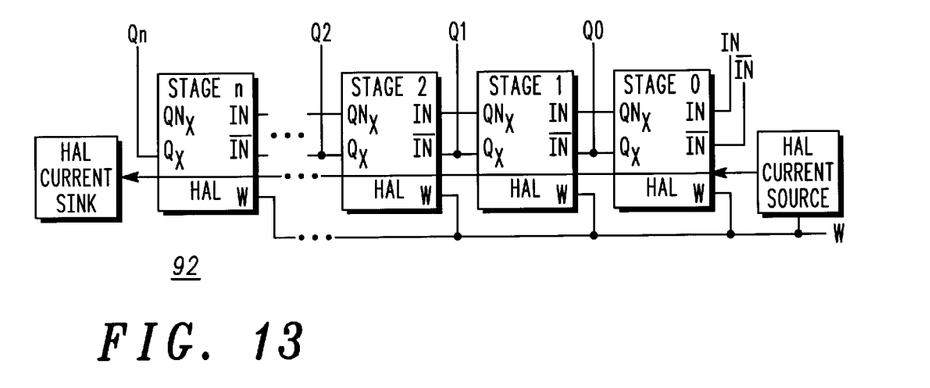
FIG. 13 illustrates a multi-stage non-volatile shift register connected for left shift operations in accordance with the present invention.

Turning now to FIG. 12, a right shifting non-volatile magnetic shift register 90 is illustrated. Register 90 includes a plurality n of register stages, each similar to stage 70 described above, connected to receive data on inputs I and IN and to shift the data to the right from stage 0 to stage n as a clock signal is applied to clock line W. To perform this function the output terminals QN and Q of each stage are connected directly to the input terminals I and IN, respectively, of the next following stage. The clock signal on clock line W is also applied to enable and disable a current sink and a current source connected to opposite ends of hard axis line HAL. A left shifting non-volatile magnetic shift register 92 is illustrated in FIG. 13 wherein the input and output terminals are simply reversed to show that a left or right shift register can be easily constructed using the above described building block, register stage 70.

Figure 14:
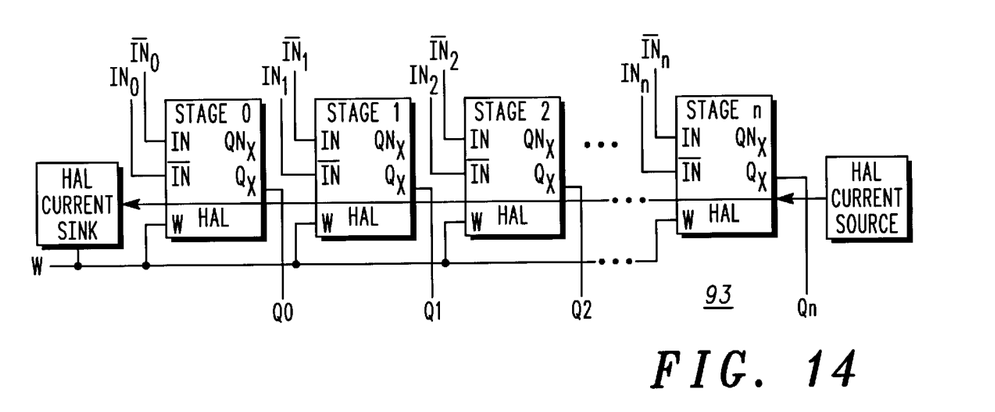
FIG. 14 illustrates a multi-stage non-volatile shift register connected for PIPO operations in accordance with the present invention.

Turning to FIG. 14, a parallel-in-parallel-out (PIPO) type of register 93 is provided using the above described building block, register stage 70. In this register, a plurality of stages 0 through n are provided, each including a register stage similar to stage 70 described above. To provide the PIPO function, the input terminals I and IN of each stage (i.e., $I_0$ and $IN_0$ through $I_n$ and $IN_n$) are provided as external inputs and an output terminal Q or QN (in this embodiment, $Q_0$ through $Q_n$) of each stage is provided.

Figure 15:
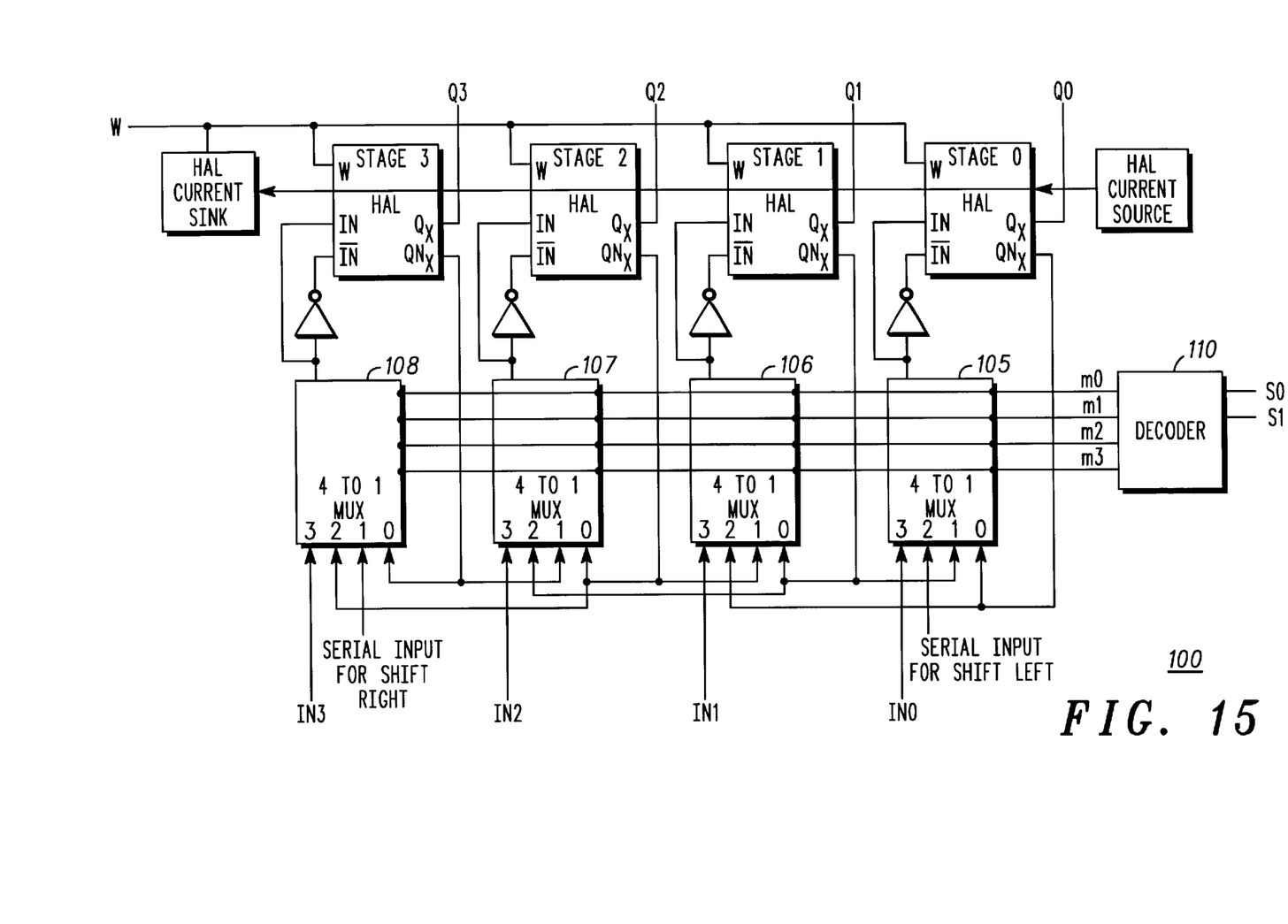
FIG. 15 illustrates a 4-bit bi-directional non-volatile shift register with parallel load in accordance with the present invention.

Turning now to FIG. 15, a 4 bit bi-directional shift register 100 with parallel load is illustrated in which four stages 0 through 3 each incorporate a stage similar to stage 70, described above. Each stage 0 through 3 of register 100 has associated therewith a 4 to 1 mux circuit 105 through 108, respectively. Each mux circuit 105 through 108 has four control inputs and four signal inputs 0 through 3. An output terminal of each mux circuit 105 through 108 is connected directly and through an inverter to the input terminals I and IN, respectively, of each associated stage 0 through 3.

A decoder circuit 110 is controlled by signals on a pair of digital input terminals S0 and S1 so as to have four possible different output signals at output terminals m0 through m3. Output terminals m0 through m3 are connected to control input terminals of each mux circuit 105 through 108.

Output terminal QN of stage 0 is connected to signal input 0 of mux circuit 105 and signal input 2 of mux circuit 106. Output terminal QN of stage 1 is connected to signal input 1 of mux circuit 105, signal input 0 of mux circuit 106, and signal input 2 of mux circuit 107. Output terminal QN of stage 2 is connected to signal input 1 of mux circuit 106, signal input 0 of mux circuit 107, and signal input 2 of mux circuit 108. Output terminal QN of stage 3 is connected to signal input 1 of mux circuit 107 and signal input 0 of mux circuit 108. Signal input terminal 2 of mux circuit 105 is connected to receive serial input data for left shift operation of shift register 100 and signal input terminal 1 of mux circuit 108 is connected to receive serial input data for right shift operation of shift register 100. Also, terminals 3 of each mux circuit 105 through 108 are connected to receive parallel input data, I0 through I3, respectively, during parallel input operation.

Decoder 110 is designed to provide a signal on output terminal m0, when a logic low is applied to the S0 and S1 terminals, which switches mux circuits 105 through 108 into a parallel-in-parallel-out mode of operation. That is, data is applied on signal terminal 3 of each mux circuit 105 through 108 and data is available on output terminals Q0 through Q3 of stages 0 through 3. Decoder 110 is designed to provide a signal on output terminal m1, when a logic low is applied to the S0 terminal and a logic high is applied to the S1 terminal, which switches mux circuits 105 through 108 into a left shift mode of operation. That is, data is applied serially to signal input 2 of mux circuit 105 and data is available serially on output terminal Q3 of stage 3. Decoder 110 is designed to provide a signal on output terminal m2, when a logic high is applied to the S0 terminal and a logic low is applied to the S1 terminal, which switches mux circuits 105 through 108 into a right shift mode of operation. That is, data is applied serially to signal input 1 of mux circuit 108 and data is available serially on output terminal Q0 of stage 0. Decoder 110 is designed to provide a signal on output terminal m3, when a logic high is applied to both the S0 terminal and the S1 terminal, which switches mux circuits 105 through 108 into a no load mode of operation. In this mode of operation the stages do not change because the input data does not change. It will be understood that bi-directional shift register 100 can be produced with any number n of stages by simply supplying n stages and n 4 to 1 mux circuits.

Thus, a new and improved non-volatile magnetic register stage is disclosed which can easily be fabricated in a variety of different registers. Further, in at least one embodiment programming current is reduced substantially since reprogramming of similar data is excluded. Also, the stages and the resulting registers are non-volatile, so that data can be stored even during power loss situations. The disclosed register stages and registers are always bistable and problems, such as metastablity, do not occur. Because of the differential operation of each register stage, resistance variations due to processing, bias voltage variations, temperature, etc. will be eliminated automatically and speed does not have to be sacrificed for operation. Further, the differential operation provides larger output signals for more efficient sensing and operation.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A non-volatile, bistable magnetic tunnel junction register cell comprising:

first and second magnetic tunnel junctions connected for differential operation;

the first magnetic tunnel junction being coupled between an easy axis line and an output terminal;

the second magnetic tunnel junction being coupled between an inverse easy axis line and an inverse output terminal;

a hard axis line coupled magnetically to both the first and second magnetic tunnel junctions; and an enable line coupled to the first and second magnetic tunnel junctions for enabling and disabling the differential operation.

2. A non-volatile, bistable magnetic tunnel junction register cell as claimed in claim 1 wherein the first and second magnetic tunnel junctions each include two layers of magnetic material separated by a tunnel barrier layer, one of the two layers of magnetic material including a substantially pinned magnetic vector and the other of the two layers of magnetic material including a magnetic vector that is free to move into and out of alignment with the pinned magnetic vector.

3. A non-volatile, bistable magnetic tunnel junction register cell as claimed in claim 1 wherein the first and second magnetic tunnel junctions connected for differential operation are formed and connected on a common supporting substrate.

4. A non-volatile, bistable magnetic tunnel junction register cell as claimed in claim 1 including in addition bi-directional current sources connected to the easy axis line and the inverse easy axis line for supplying differential currents to the first magnetic tunnel junction and the second magnetic tunnel junction.

5. A non-volatile, bistable magnetic tunnel junction register cell as claimed in claim 1 including in addition a latch circuit coupled to at least one of the output terminal and the inverse output terminal for supplying output signals to a subsequent circuit.

6. A non-volatile, bistable magnetic tunnel junction register cell as claimed in claim 4 including in addition differential data input terminals coupled to the bi-directional current sources, a comparator circuit coupled to one of the differential data input terminals, one of the output terminal and the inverse output terminal, and the bi-directional current sources for disabling the bi-directional current sources when data at the one of the differential data input terminals compares to data at the one of the output terminal and the inverse output terminal.

7. A non-volatile, bistable magnetic tunnel junction register cell comprising:

a first magnetic tunnel junction with a first side connected through a first series connected pair of transistors to an output terminal and a second magnetic tunnel junction with a first side connected through a second series connected pair of transistors to an inverse output terminal, a second side of the first magnetic tunnel junction being connected to an easy axis line and a second side of the second magnetic tunnel junction being connected to an inverse easy axis line, and a control terminal of a first of the first series connected pair of transistors being connected to an enable line and a control terminal of a first of the second series connected pair of transistors being connected to the enable line;

the output terminal being coupled through a first enable transistor to a power input terminal with a control terminal of the first enable transistor connected to the enable line, and the inverse output terminal being coupled through a second enable transistor to the power input terminal with a control terminal of the second enable transistor connected to the enable line;

the output terminal being coupled through a first differential transistor to the power input terminal with a control terminal of the first differential transistor being connected to a control terminal of a second of the first series connected pair of transistors and to the inverse output terminal, and the inverse output terminal being coupled through a second differential transistor to the power input terminal with a control terminal of the second differential transistor connected to a control terminal of a second of the second series connected pair of transistors and to the output terminal; and a hard axis line coupled magnetically to both the first and second magnetic tunnel junctions.

8. A non-volatile, bistable magnetic tunnel junction register cell as claimed in claim 7 wherein the first and second series connected pairs of transistors, the first and second enable transistors, and the first and second differential transistors are formed in a semiconductor substrate and the first and second magnetic tunnel junctions are formed in layers positioned on the semiconductor substrate.

9. A non-volatile, bistable magnetic tunnel junction register cell as claimed in claim 7 wherein the first and second magnetic tunnel junctions each include two layers of magnetic material separated by a tunnel barrier layer, one of the two layers of magnetic material including a substantially pinned magnetic vector and the other of the two layers of magnetic material including a magnetic vector that is free to move into and out of alignment with the pinned magnetic vector.

10. A non-volatile, bistable magnetic tunnel junction register cell as claimed in claim 7 including in addition bi-directional current sources connected to the easy axis line and the inverse easy axis line for supplying differential currents to the first magnetic tunnel junction and the second magnetic tunnel junction.

11. A non-volatile, bistable magnetic tunnel junction register cell as claimed in claim 7 including in addition a latch circuit coupled to at least one of the output terminal and the inverse output terminal for supplying output signals to a subsequent circuit.

12. A non-volatile, bistable magnetic tunnel junction register cell as claimed in claim 11 including in addition differential data input terminals coupled to the bi-directional current sources, a comparator circuit coupled to one of the differential data input terminals, one of the output terminal and the inverse output terminal, and the bi-directional current sources for disabling the bi-directional current sources when data at the one of the differential data input terminals compares to data at the one of the output terminal and the inverse output terminal.

13. A plurality of register cells connected to form a non-volatile register comprising:

a plurality of non-volatile register cells with each register cell including first and second magnetic tunnel junctions connected for differential operation, the first magnetic tunnel junction being coupled between an easy axis line and an output terminal and the second magnetic tunnel junction being coupled between an inverse easy axis line and an inverse output terminal, a hard axis line coupled magnetically to both the first and second magnetic tunnel junctions, and an enable line coupled to the first and second magnetic tunnel junctions for enabling and disabling the differential operation; and circuitry coupled to the easy axis line, the inverse easy axis line, the hard axis line, the enable line, and the output terminal of each register cell in the plurality of non-volatile register cells to provide a plurality of parallel inputs and a plurality of parallel outputs.

14. A plurality of register cells connected to form a non-volatile register as claimed in claim 13 wherein the circuitry includes a clock line coupled to the enable line of each of the plurality of non-volatile register cells for simultaneously clocking information into each of the plurality of non-volatile register cells and simultaneously clocking information out of each of the plurality of non-volatile register cells.

15. A plurality of register cells connected to form a non-volatile register as claimed in claim 13 including in addition bi-directional current sources connected to the easy axis line and the inverse easy axis line of each of the plurality of non-volatile register cells for supplying differential currents to the first magnetic tunnel junction and the second magnetic tunnel junction of each of the plurality of non-volatile register cells.

16. A plurality of register cells connected to form a non-volatile register as claimed in claim 13 including in addition a latch circuit coupled to at least one of the output terminal and the inverse output terminal of each of the plurality of non-volatile register cells for supplying output signals to a subsequent circuit.

17. A plurality of register cells connected to form a non-volatile register as claimed in claim 16 including in addition differential data input terminals coupled to the bi-directional current sources, a comparator circuit coupled to one of the differential data input terminals, one of the output terminal and the inverse output terminal, and the bi-directional current sources of each of the plurality of non-volatile register cells for disabling the bi-directional current sources when data at the one of the differential data input terminals compares to data at the one of the output terminal and the inverse output terminal.

18. A plurality of register cells connected to form a non-volatile register as claimed in claim 13 wherein the first and second magnetic tunnel junctions of each of the plurality of non-volatile register cells each include two layers of magnetic material separated by a tunnel barrier layer, one of the two layers of magnetic material including a substantially pinned magnetic vector and the other of the two layers of magnetic material including a magnetic vector that is free to move into and out of alignment with the pinned magnetic vector.

19. A non-volatile, bistable magnetic tunnel junction shift register stage comprising:

first and second magnetic tunnel junctions connected for differential operation, the first magnetic tunnel junction being coupled between an easy axis line and an output terminal and the second magnetic tunnel junction being coupled between an inverse easy axis line and an inverse output terminal, a hard axis line coupled magnetically to both the first and second magnetic tunnel junctions, and an enable line coupled to the first and second magnetic tunnel junctions for enabling and disabling the differential operation; and circuitry coupled to the easy axis line, the inverse easy axis line, the hard axis line, the enable line, the output terminal, and the inverse output terminal, and the circuitry including a data input terminal, an inverse data input terminal, a data output terminal, an inverse data output terminal and a clock terminal.

20. A non-volatile, bistable magnetic tunnel junction shift register stage as claimed in claim 19 wherein the first and second magnetic tunnel junctions each include two layers of magnetic material separated by a tunnel barrier layer, one of the two layers of magnetic material including a substantially pinned magnetic vector and the other of the two layers of magnetic material including a magnetic vector that is free to move into and out of alignment with the pinned magnetic vector.

21. A non-volatile, bistable magnetic tunnel junction shift register stage as claimed in claim 19 including in addition bi-directional current sources connected to the easy axis line and the inverse easy axis line for supplying differential currents to the first magnetic tunnel junction and the second magnetic tunnel junction.

22. A non-volatile, bistable magnetic tunnel junction shift register stage as claimed in claim 19 including in addition a latch circuit coupled to at least one of the output terminal and the inverse output terminal for supplying output signals to a subsequent circuit.

23. A non-volatile, bistable magnetic tunnel junction shift register stage as claimed in claim 22 including in addition differential data input terminals coupled to the bi-directional current sources, a comparator circuit coupled to one of the differential data input terminals, one of the output terminal and the inverse output terminal, and the bi-directional current sources for disabling the bi-directional current sources when data at the one of the differential data input terminals compares to data at the one of the output terminal and the inverse output terminal.

* * * * *

UNITED STATES PATENT AND TRADEMARK OFFICE
CERTIFICATE OF CORRECTION

PATENT NO.    : 6,515,895 B2  Page 1 of 1
DATED         : February 4, 2003
INVENTOR(S)   : Naji It is certified that error appears in the above-identified patent and that said Letters Patent is hereby corrected as shown below:

<u>Title page,</u>
After the TITLE, please add as a new first paragraph the following paragraph:
-- This invention was made with Government support under Agreement No. MDA972-96-3-0016 awarded by DARPA. The Government has certain rights in the invention. --

Signed and Sealed this

Seventh Day of October, 2003

JAMES E. ROGAN
*Director of the United States Patent and Trademark Office*